United States Patent
Yoshimochi

(10) Patent No.: US 7,459,749 B2
(45) Date of Patent: Dec. 2, 2008

(54) HIGH SPEED POWER MOSFET

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 85 days.

(21) Appl. No.: 10/986,988

(22) Filed: Nov. 15, 2004

(65) Prior Publication Data

US 2005/0104093 A1  May 19, 2005

(30) Foreign Application Priority Data

Nov. 17, 2003  (JP) .............................. 2003-387066

(51) Int. Cl.
*H01L 29/94* (2006.01)

(52) U.S. Cl. .................. 257/332; 257/397; 257/520; 257/E29.201

(58) Field of Classification Search ................ 257/332, 257/397, 520, E29.201; 438/270
See application file for complete search history.

(56) References Cited

U.S. PATENT DOCUMENTS

| | | | | |
|---|---|---|---|---|
| 4,835,586 A | * | 5/1989 | Cogan et al. ................. | 257/260 |
| 5,442,214 A | * | 8/1995 | Yang ........................... | 257/328 |
| 6,040,212 A | * | 3/2000 | Kim ............................ | 438/242 |
| 6,239,465 B1 | * | 5/2001 | Nakagawa ................... | 257/331 |
| 6,274,905 B1 | | 8/2001 | Mo | |
| 6,707,100 B2 | * | 3/2004 | Gajda ......................... | 257/330 |
| 6,717,210 B2 | * | 4/2004 | Takano et al. ............... | 257/330 |
| 6,818,946 B1 | * | 11/2004 | Venkatraman .............. | 257/330 |
| 6,844,591 B1 | * | 1/2005 | Tran ........................... | 257/330 |
| 2001/0031551 A1 | * | 10/2001 | Hshieh et al. ............... | 438/637 |
| 2003/0170955 A1 | * | 9/2003 | Kawamura et al. .......... | 438/270 |

FOREIGN PATENT DOCUMENTS

JP  2000183337 A  *  6/2000  .......... 257/E29.156

* cited by examiner

*Primary Examiner*—Howard Weiss
*Assistant Examiner*—John C Ingham
(74) *Attorney, Agent, or Firm*—Rabin & Berdo, PC

(57) ABSTRACT

A semiconductor device provided with: a channel region formed in a surface of a semiconductor substrate in a predetermined depth range, a trench being formed in the surface as penetrating the channel region in a depthwise direction; a gate insulating film formed on an inside wall of the trench, the gate insulating film being in contact with the channel region; and a gate electrode including: a polysilicon layer opposing the channel region with the gate insulating film interposed therebetween, the polysilicon layer being embedded in an internal space of the trench at least in the predetermined depth range; and a low-resistance layer essentially formed from a metal element and disposed in the trench above the polysilicon layer that opposes the channel region.

4 Claims, 5 Drawing Sheets

HIGH SPEED POWER MOSFET

BACKGROUND OF THE INVENTION

1. Field of the Invention

The present invention relates to a semiconductor device having a trench structure and a method for fabricating the same.

2. Description of Related Art

Some power MOS FETs (Metal-Oxide-Semiconductor Field Effect Transistor) have a construction wherein a gate electrode is embedded in a trench formed in a semiconductor substrate (a thin film overlaid on the semiconductor substrate). Conventionally, polysilicon rendered conductive by introducing impurities therein has been used as a material for forming the gate electrode.

However, the gate electrode formed of polysilicon has such a high resistance that the switching operations of the MOS FET cannot be increased in speed. In this connection, efforts have been made to achieve high-speed switching operations of the MOS FET by reducing the resistance of the gate electrode.

FIG. 5 is a sectional view illustrating a construction of a conventional semiconductor device formed with the MOS FET having a trench structure. Such a semiconductor device is disclosed in, for example, U.S. Pat. No. 6,274,905.

The semiconductor device 50 includes an $N^-$ region 51 formed on a semiconductor substrate, and a semiconductor layer 52 overlaid on the $N^-$ region 51. The semiconductor device 50 is further formed with a plurality of trenches 53 penetrating through the semiconductor layer 52 to reach a surface of the $N^-$ region 51.

An $N^+$ region 54 is formed at a surface of the semiconductor layer 52 at an edge of the trench 53. A $P^+$ region 55 is formed between the $N^+$ regions 54 formed at the individual edges of two adjoining trenches 53. The remainder of the semiconductor layer 52 (a portion exclusive of the $N^+$ region 54 and the $P^+$ region 55) defines a $P^-$ region 56. The trench 53 penetrates through the $P^-$ region 56.

An insulating (dielectric) layer 57 such as formed of silicon oxide is formed along an inside wall of the trench 53. A gate electrode 62 is disposed in the trench 53. The gate electrode 62 includes a polysilicon layer (buffer layer) 58, a low-resistance layer (a core of high conductivity) 59, and a polycide layer 63 formed between the polysilicon layer 58 and the low-resistance layer 59. The polysilicon layer 58 is rendered conductive by introducing impurities therein. The low-resistance layer 59 contains therein a metal having a high melting point (such as tungsten (W)). In a case where the low-resistance layer 59 contains tungsten, the polycide layer 63 contains therein tungsten polycide (WSi).

The polysilicon layer 58 is formed on the insulating layer 57 in a manner to conform to the inside wall of the trench 53. The remainder in the trench 53 (a further inward region) is filled with the low-resistance layer 59. With respect to a depthwise direction of the trench 53, the low-resistance layer 59 is formed in a depth range substantially corresponding to a depth in which the $P^-$ region 56 is formed. Thus, the low-resistance layer 59 is in opposing relation with the $P^-$ region 56 with the insulating layer 57 and the polysilicon layer 58 interposed therebetween.

Formed on the semiconductor layer 52 is an electrode film (metallic source layer) 60 electrically connected with the $N^+$ region 54 and the $P^+$ region 55. Formed over the trench 53 is an insulating (dielectric) layer 61, which electrically isolates the polysilicon layer 58 and the low-resistance layer 59 from the electrode film 60.

A proper voltage is applied between the $N^-$ region 51 and the electrode film 60, and the gate electrode 62 is set at a proper potential, whereby a channel is formed in the $P^-$ region 56 in the vicinity of an interface with the insulating layer 57 so that an electric current is allowed to flow between the $N^-$ region 51 and the electrode film 60.

The gate electrode 62 of this semiconductor device 50 is reduced in resistance as compared with a gate electrode consisting of polysilicon. Hence, the semiconductor device 50 has achieved high-speed switching operations.

However, in a case where a metal is used as a material for forming the gate electrode 62, the semiconductor device 50 encounters a great shift of drive voltage compared with the case where the gate electrode consists of polysilicon. The drive voltage of the semiconductor device 50 depends upon a threshold voltage $V_T = V_{FB} + 2\psi_B + (2\epsilon_s q N_A (2\psi_B))^{1/2}/C_0 = (\phi - Q_f/C_0) + 2\psi_B + (4\epsilon_s q N_A \psi_B)^{1/2}/C_0$.

In the above expression, $V_{FB}$ represents a flat-band voltage; $\psi_B$ represents an electrostatic potential at an interior (bulk) of the semiconductor device (the $P^-$ region 56); $\epsilon_s$ represents a dielectric constant of the semiconductor portion (the $P^-$ region 56); q represents an elementary electric charge; $N_A$ represents a concentration of acceptor impurities; $C_0$ represents a per-unit-area capacitance of the insulating layer 57; $\phi$ represents a difference between a work function of the gate electrode 62 (the polysilicon layer 58) and a work function of the semiconductor portion (the $P^-$ region 56) (hereinafter, simply referred to as "work function difference"), the gate electrode opposing the semiconductor portion via the insulating layer 57; and $Q_f$ represents a fixed charge in the insulating layer 57. That is, the threshold voltage varies depending upon the work function difference $\phi$.

Since not only the polysilicon layer 58 but also the low-resistance layer 59 containing the metal (having the high melting-point) are in opposing relation with the $P^-$ region 56, the work function difference $\phi$ is greatly shifted compared with that of the semiconductor device wherein only the polysilicon layer 58 opposes the $P^-$ region 56 via the insulating layer 57. Accordingly, there is a great difference between the threshold voltage $V_T$ of the common MOS FET employing the gate electrode consisting of polysilicon and that of the semiconductor device 50 employing the gate electrode mainly consisting of metal. Hence, the drive voltage differs greatly between the common MOS FET and the semiconductor device 50.

In other words, the semiconductor device 50 must be drastically changed in design if the semiconductor device employing the gate electrode 62 essentially consisting of metal is to retain unchanged device characteristics such as the drive voltage.

More recently, the patterns have been miniaturized even further, so that the trench 53 may sometimes be formed in depth on the order of 1 μm to 3 μm and in width on the order of 0.3 μm to 0.5 μm. An expensive apparatus must be used in order to embed the metal favorably (densely) in the trench 53 having such a high aspect ratio.

SUMMARY OF THE INVENTION

It is an object of the invention to provide a semiconductor device adapted for high-speed operations while maintaining the drive voltage of the conventional semiconductor device.

It is another object of the invention to provide a semiconductor device which can be fabricated by an inexpensive apparatus.

It is still another object of the invention to provide a method for fabricating the semiconductor device adapted for high-speed operations while maintaining the drive voltage of the conventional semiconductor device.

It is still another object of the invention to provide a method for fabricating the semiconductor device which can be fabricated by an inexpensive apparatus.

The semiconductor device according to the invention comprises: a channel region formed in a surface of a semiconductor substrate in a predetermined depth range, a trench being formed in the surface as penetrating the channel region in a depthwise direction; a gate insulating film formed on an inside wall of the trench, the gate insulating film being in contact with the channel region; and a gate electrode including: a polysilicon layer opposing the channel region with the gate insulating film interposed therebetween, the polysilicon layer being embedded in an internal space of the trench at least in the predetermined depth range; and a low-resistance layer essentially formed from a metal element and disposed in the trench above the polysilicon layer that opposes the channel region.

According to the invention, the polysilicon layer is embedded in the internal space of the trench in the predetermined depth range (the depth range corresponding to a range of depth in which the channel region is formed). The low-resistance layer essentially formed from the metal element is formed above the portion opposing the channel region so that the low-resistance layer does not oppose the channel region. Accordingly, the semiconductor device has a work function difference $\phi$ equivalent to that of a semiconductor device including a gate electrode consisting of only polysilicon and hence, has a threshold voltage $V_T$ equivalent to that of the latter semiconductor device. Thus, the semiconductor device of the invention is capable of maintaining the drive voltage of the conventional semiconductor device.

On the other hand, the low-resistance layer essentially formed of the metal has a lower specific resistance than polysilicon. Therefore, the gate electrode of this semiconductor device has a lower resistance than the gate electrode consisting of only polysilicon. This leads to the reduction of the switching time of devices formed on the semiconductor device, thus allowing the semiconductor device to perform high-speed operations.

In the fabrication of the semiconductor device, the gate electrode may be formed by embedding the polysilicon layer in the trench up to a predetermined depth (to an upper end of the aforesaid predetermined depth range), followed by forming the low-resistance layer. Accordingly, the low-resistance layer only need to be embedded in a shallow cavity defined in the trench after the polysilicon layer is embedded therein. That is, the necessity of embedding the metal material in the trench having a high aspect ratio is eliminated, so that the low-resistance layer may be formed using a sputtering apparatus commonly used in the art. Accordingly, the semiconductor device of the invention can be fabricated by the inexpensive apparatus.

The semiconductor device may be a MOS FET (Metal Oxide Semiconductor Field Effect Transistor) or an IGBT (Insulated Gate Bipolar Transistor).

The semiconductor substrate may have electrodes such as a source electrode, or a wiring member formed thereon. In this case, an insulating layer may be formed on the gate electrode for electrically isolating such electrodes or the wiring member from the gate electrode.

The aforesaid metal element of the low-resistance layer may be at least one of aluminum (Al), copper (Cu), tungsten (W), titanium (Ti), nickel (Ni), molybdenum (Mo), cobalt (Co), silver (Ag), platinum (Pt) and lead (Pb).

Furthermore, the aforesaid metal element may be contained in the low-resistance layer as metal silicide.

The semiconductor may further comprise a barrier metal layer interposed between the polysilicon layer and the low-resistance layer such that the metal atoms diffusion from the low-resistance layer into the polysilicon layer is retarded.

According to this arrangement, the barrier metal layer suppresses (prevents) the shift of the threshold voltage, the shift being caused by the metal atoms, as the component of the low-resistance layer, diffusing into the polysilicon layer.

The barrier metal layer may comprise, for example, a metal nitride such as titanium nitride (TiN) or tungsten nitride ($WN_x$). Alternatively, the barrier metal layer may comprise a metal such as titanium (Ti).

The aforesaid low-resistance layer may be formed as extending beyond the surface of the substrate.

According to this arrangement, the low-resistance layer is increased in the sectional area of a plane perpendicular to a lengthwise direction thereof (a direction in which the gate electrode is laid) because the low-resistance layer is extended from place within the trench to place outside of the trench. Thus, the gate electrode is reduced in the resistance with respect to this direction.

The semiconductor device may further comprise an insulating layer disposed on the low-resistance layer and having a top surface positioned within the trench.

In the fabrication of such a semiconductor device, the top surface of the insulating layer can be positioned within the trench by overlaying the insulating layer on the overall surface of the semiconductor substrate and then etching back the overall surface of the insulating layer by a proper etch-back thickness. In other words, it is not required to form a mask (resist film) having a predetermined opening pattern in alignment with the semiconductor substrate and to etch away only a predetermined area of the insulating layer. Therefore, it is easy to fabricate the semiconductor device.

A method for fabricating a semiconductor device according to the invention comprises the steps of: forming a trench in a surface of a semiconductor substrate to be formed with a channel region in a predetermined depth range, the trench having a sufficient depth for penetrating through the channel region and being formed in a region permitting the trench to penetrate through the channel region; forming, on an inside wall of the trench, a gate insulating film to be in contact with the channel region; forming a polysilicon layer embedded in the trench so as to fill in a space of the predetermined depth range; and forming a low-resistance layer essentially from a metal element after the step of forming the polysilicon layer, the low-resistance layer being disposed in the trench above the polysilicon layer and constituting a gate electrode jointly with the polysilicon layer.

The channel region may be formed prior to the step of forming the trench or otherwise, may be formed after the step of forming the trench.

The method for fabricating the semiconductor device may further comprise a step of forming a barrier metal layer, the step performed after the step of forming the polysilicon layer and prior to the step of forming the low-resistance layer, the barrier metal layer being to be interposed between the polysilicon layer and the low-resistance layer for retarding the metal atoms diffusion from the low-resistance layer into the polysilicon layer.

The step of forming the low-resistance layer may include a step of disposing the low-resistance layer within the trench partially. In this case, the aforesaid method may further comprise the steps of: filling a cavity formed at an upper area in the trench by the step of disposing the low-resistance layer within the trench partially with an insulating layer; and etching back the insulating layer until a top surface of the insulating layer is positioned in the trench, the etching back step being performed after the step of filling the cavity.

In order to form the insulating layer at a predetermined region or within the trench, what is needed is to overlay the insulating layer on the overall surface of the semiconductor substrate and then, to etch back the overall surface of the insulating layer by a proper etch-back thickness. That is, it is not required to form the mask (resist film) having the predetermined opening pattern in alignment with the semiconductor substrate and to etch away only the predetermined area of the insulating layer. Hence, this method provides an easy fabrication of the semiconductor device formed with the insulating layer at the predetermined region.

The insulating layer may be formed of silicon oxide, for example.

The above and other objects, features and effects of the invention will become apparent from the following description of the preferred embodiments thereof taken with reference to the accompanying drawings.

DESCRIPTION OF THE PREFERRED EMBODIMENTS

Figure 1:
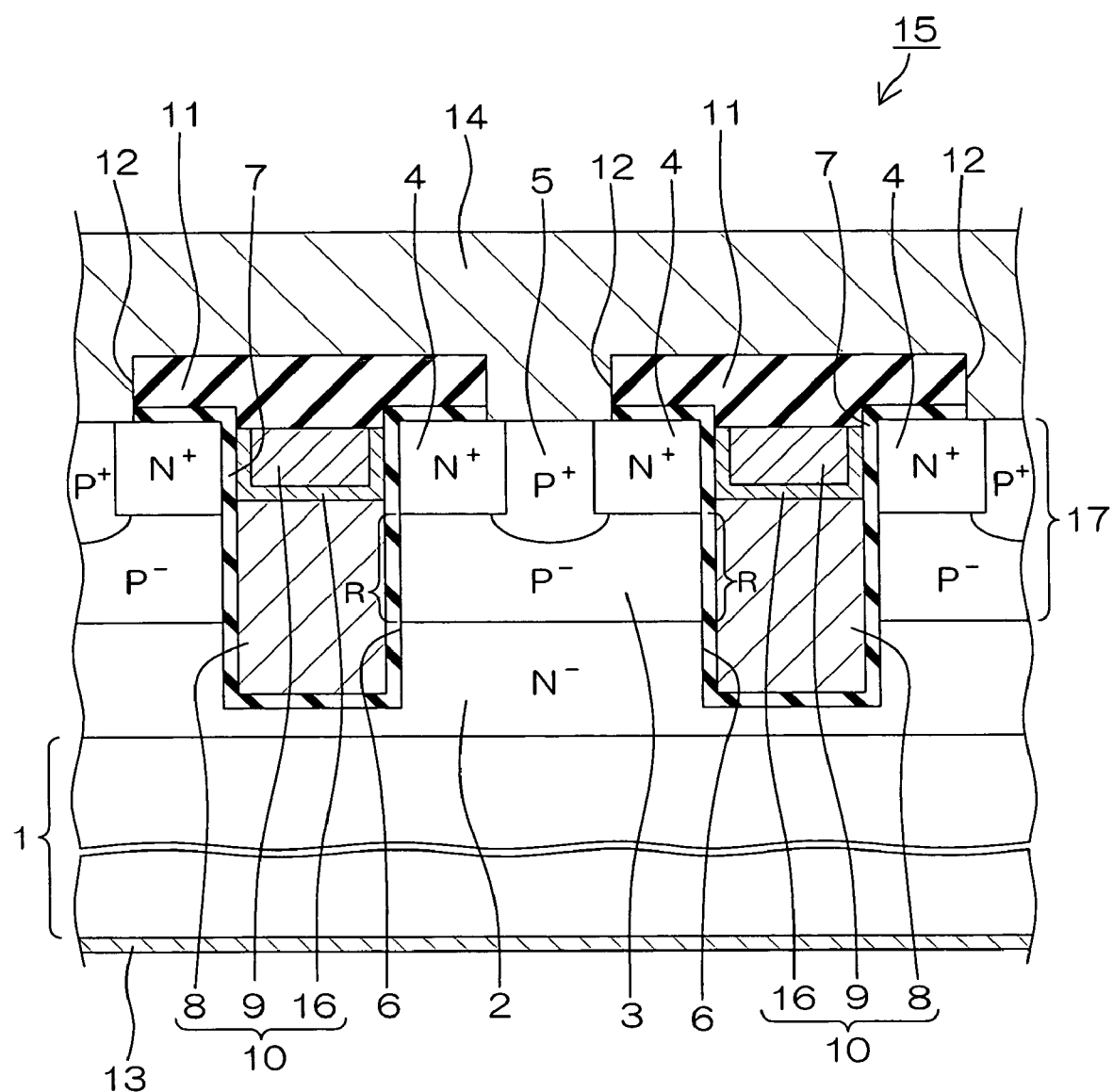
FIG. 1 is a sectional view illustrating a construction of a semiconductor device according to a first embodiment of the invention.

FIG. 1 is a sectional view illustrating a construction of a semiconductor device according to a first embodiment of the invention.

The semiconductor device 15 comprises a MOS Field Effect Transistor (MOS FET) formed on a silicon substrate 1. Overlaid on the silicon substrate 1 is an $N^-$ epitaxial layer 2 defining a drain region, whereas a semiconductor layer 17 is overlaid on the $N^-$ epitaxial layer 2.

A trench 6 is formed as penetrating through the semiconductor layer 17 to reach some midpoint with respect to a depthwise direction of the $N^-$ epitaxial layer 2. The trench 6 has a width on the order of 0.3 µm to 0.5 µm, for example, and a depth on the order of 1 µm to 3 µm, for example.

An $N^+$ source region 4 is formed in a surface of the semiconductor layer 17 at an edge of the trench 6. A $P^+$ base region 5 is formed between the $N^+$ source regions 4 formed at the individual edges of two adjoining trenches 6, as in contact with these $N^+$ source regions 4. The remainder of the semiconductor layer 17 (a portion exclusive of the $N^+$ source regions 4 and the $P^+$ base regions 5) defines a $P^-$ region 3.

The trench 6 penetrates through the $P^-$ region 3. The $P^-$ region 3 is disposed between the epitaxial layer 2 and the $N^+$ source region 4 plus the $P^+$ base region 5 and appears to an inside wall of the trench 6 over a predetermined depth range R.

An oxide film 7 of silicon oxide ($SiO_2$) is formed as covering the inside wall of the trench 6. The oxide film 7 is extended over the $N^+$ source regions 4 (over a periphery of the edge of the trench 6).

A gate electrode 10 is disposed in a manner to fill in an internal space of the trench 6. Referring to FIG. 1, the gate electrode 10 is extended in a direction perpendicular to the drawing surface so as to be extracted to the outside at a place unillustrated in the figure. The gate electrode 10 includes: a polysilicon layer 8 disposed on a bottom side of the trench 6 with respect to a depthwise direction thereof; a low-resistance layer 9 disposed on an upper side of the trench 6 with respect to the depthwise direction thereof; and a barrier metal layer 16 interposed between the polysilicon layer 8 and the low-resistance layer 9. The polysilicon layer 8, the low-resistance layer 9 and the barrier metal layer 16 are all extended in a longitudinal direction of the gate electrode 10 (the direction perpendicular to the drawing surface of FIG. 1).

The polysilicon layer 8 is formed of polysilicon rendered conductive (reduced in resistance) by introducing impurities therein.

The low-resistance layer 9 is formed of metal element such as aluminum (Al), copper (Cu), tungsten (W), titanium (Ti), nickel (Ni), molybdenum (Mo), cobalt (Co), silver (Ag), platinum (Pt) or lead (Pb); or any one of alloys or metal silicides thereof. The low-resistance layer 9 has a lower specific resistance than the polysilicon layer 8.

The barrier metal layer 16 is formed of conductive material which includes, for example, metal such as titanium (Ti), metal nitride such as titanium nitride (TiN) and tungsten titanium ($WN_x$), and the like. The barrier metal layer 16 retards (prevents) the diffusion of metal atoms through the barrier metal layer 16, which occurs during or subsequent to the fabrication process of the semiconductor device 15. For instance, the barrier metal layer 16 retards (prevents) metal atoms diffusion from the low-resistance layer 9 into the polysilicon layer 8 or the semiconductor layer 17.

The polysilicon layer 8 opposes the $P^-$ region 3 with the oxide film 7 interposed therebetween, as filling the internal space of the trench 6 including the aforesaid predetermined depth range R in which the $P^-$ region 3 is formed. An interface between the polysilicon layer 8 and the barrier metal layer 16 is located at a smaller depth with respect to the depthwise direction of the trench 6 than the depth range in which the $P^-$ region 3 appears to the inside wall of the trench 6. Any part of the low-resistance layer 9 or the barrier metal layer 16 does not oppose the $P^-$ region 3. In the trench 6, only the polysilicon layer 8 of the gate electrode 10 is in the opposing relation with the $P^-$ region 3.

A silicon oxide layer 11 is formed over the gate electrode 10 and the semiconductor layer 17. The silicon oxide layer 11 is formed with a contact hole 12 penetrating therethrough with respect to a depthwise direction thereof. Appeared in the contact hole 12 are a part of the $N^+$ source region 4 as well as the $P^+$ base region 5. An electrode film 14 such as formed of Al or alloy of Al and Si is formed as covering the silicon oxide film 11 and filling in the contact hole 12. The electrode film 14 is electrically connected with the $N^+$ source region 4 and the $P^+$ base region 5, but is electrically isolated from the gate electrodes 10 by means of the silicon oxide film 11.

Formed on an opposite side of the silicon substrate 1 from the $N^-$ epitaxial layer 2 is a metal complex film 13 comprising a plurality of laminated metal films containing Au, Ti, Ni, Ag and the like. Of the metal complex film 13, a portion contacting the silicon substrate 1 is defined by a film formed of Au. The semiconductor device 15 is adapted for connection with a lead frame or the like on its side formed with the metal complex film 13.

The gate electrode 10 includes the low-resistance layer 9 having the lower specific resistance than the polysilicon layer 8 and hence, the gate electrode 10 is reduced in resistance along the longitudinal direction thereof, as compared with the case where the gate electrode consists of only polysilicon. Even in a case where the gate electrode 10 is formed in an elongated shape having a narrow width, in particular, the gate electrode 10 has a sufficiently low resistance.

Thus is accomplished the reduction of switching time of a device formed on the semiconductor device 15, which is able to perform high-speed operations. Furthermore, the semiconductor device 15 is adapted for the reduction of switching loss so that the power consumption is reduced. Accordingly, the semiconductor device may preferably be applied to DC-DC converter circuits, switching circuits and the like.

The gate electrode 10 is set to a suitable potential, while a proper voltage is applied between the metal complex film 13 and the electrode film 14, whereby a channel is formed in the P$^-$ region 3 in the vicinity of the interface with the oxide film 7, the channel allowing the electric current to flow between the metal complex film 13 and the electrode film 14. In the oxide film 7, a portion sandwiched between the P$^-$ region 3 and the gate electrode 10 (the polysilicon layer 8) and its peripheral area function as a gate insulating film.

The drive voltage of the semiconductor device 15 depends upon the threshold voltage, which depends upon the work function of the gate electrode 10 in opposing relation with the P$^-$ region 3. In the semiconductor device 15, the overall area of the P$^-$ region 3 that appears to the inside wall of the trench 6 is opposed only by the polysilicon layer 8 of the gate electrode 10, but not by the low-resistance layer 9 essentially consisting of the metal element. Therefore, the threshold voltage of this semiconductor device 15 (MOS FET) is equal to that of the conventional MOS FET commonly used in the art, the gate electrode of which consists of polysilicon. Thus, the semiconductor device 15 may be operated with the drive voltage equal to that of the conventional MOS FET.

Since the gate electrode 10 is further formed with the barrier metal layer 16, the shift of the threshold voltage are suppressed (prevented), the shift caused by the metal atoms diffused in the polysilicon layer 8, the metal atoms constituting the low-resistance layer 9.

Figure 2A:
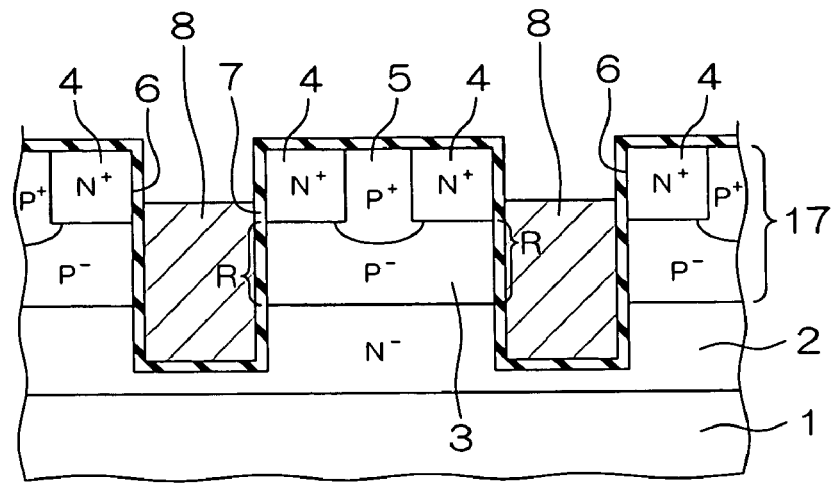
FIG. 2(a), FIG. 2(b) and FIG. 2(c) are sectional views each illustrating a step of method for fabricating the semiconductor device of FIG. 1.

FIG. 2(*a*) through FIG. 2(*c*) are sectional views for illustrating a method for fabricating the semiconductor device 15.

First, the N$^-$ epitaxial layer 2 is overlaid on the silicon substrate 1. Subsequently, impurities are introduced into an upper part of the N$^-$ epitaxial layer 2 so as to form the semiconductor layer 17 as follows. Firstly, impurities for imparting the P-type conductivity are implanted from the surface of the N$^-$ epitaxial layer 2 and diffused therein, so as to convert the upper part of the N$^-$ epitaxial layer 2 into the P$^-$ region 3. Subsequently, impurities for imparting the P-type conductivity and the N-type conductivity are implanted using a resist film (not shown) having openings at predetermined positions, thereby forming the P$^+$ base region 5 and the N$^+$ source region 4 at an upper part of the P$^-$ region 3.

Then, an etching process (such as Reactive Ion Etching) is performed using a resist film (not shown) having an opening at a predetermined position as a mask. Thus is formed the trench 6 penetrating through the semiconductor layer 17 to reach some midpoint with respect to the depthwise direction of the N$^-$ epitaxial layer 2. The P$^-$ region 3 is exposed from the inside wall of the trench 6 over the predetermined depth range R. The width of the trench 6 is on the order of 0.3 μm to 0.5 μm, for example, whereas the depth of the trench 6 is on the order of 1 μm to 3 μm, for example.

Subsequently, the silicon substrate 1 is heated for thermally oxidizing the exposed surface thereof, which includes portions near the surfaces of the N$^+$ source region 4 and P$^+$ base region 5, and a portion near an inside surface of the trench 6. Thus is formed the oxide film 7.

Next, the polysilicon layer 8 is formed on the oxide film 7. The polysilicon layer 8 is formed in a manner to fill in the internal space of the trench 6. This step is performed by the LPCVD (Low Pressure Chemical Vapor Deposition) method. Thus, the internal space of the trench 6 having a high aspect ratio may preferably (densely) be filled with the polysilicon layer 8.

Subsequently, the polysilicon layer 8 is etched back so as to remove a portion of the polysilicon layer 8 positioned outside of the trench 6 and an upper part of the polysilicon layer 8 in the trench 6. In this process, an etch-back thickness is so controlled as to prevent the P$^-$ region 3 exposed from the inside wall of the trench 6 from appearing from the remaining portion of the polysilicon layer 8 while providing a cavity at an upper area in the trench 6. Thus, the internal space of the trench 6 is filled with the polysilicon layer 8, the internal space including the aforesaid predetermined depth range R in which the P$^-$ region 3 is formed. This state is shown in FIG. 2(*a*).

Next, the barrier metal layer 16 is formed in a manner to cover the exposed surfaces of the oxide film 7 and the polysilicon layer 8. The barrier metal layer 16 is formed in such a thickness as not to fill in the trench 6 completely. Specifically, the cavity is provided at the upper area in the trench 6. The depth of the cavity is, for example, 0.5 μm or so.

Subsequently, the low-resistance layer 9 is overlaid on the barrier metal layer 16. The low-resistance layer 9 is formed in a manner to substantially completely fill in the cavity in the trench 6. This step may be performed by the sputtering method. Since the polysilicon layer 8 and the barrier metal layer 16 are already disposed in the trench 6 so that the cavity of the trench 6 is sufficiently reduced in the aspect ratio, a sputtering apparatus commonly used in the art may be employed for densely (without producing cavities) embedding the low-resistance layer 9 in the trench 6. This state is shown in FIG. 2(*b*).

Subsequently, the metal complex layer 13 (see FIG. 1) is formed on the opposite side of the silicon substrate 1 from the N$^-$ epitaxial layer 2.

Next, the low-resistance layer 9 and the barrier metal layer 16 are etched back. Thus, individual portions of the low-resistance layer 9 and the barrier metal layer 16 positioned outside of the trench 6 are removed, so that a surface of the low-resistance layer 9 and end faces of the barrier metal layer 16 become substantially flush with the surfaces of the N$^+$ source region 4 and the P$^+$ base region 5. In a case where the barrier metal layer 16 is formed of metal (not metal nitride), the barrier metal layer 16 may readily be etched into this state. The remainders of the polysilicon layer 8, the barrier metal layer 16 and the low-resistance layer 9 form the gate electrode 10.

Subsequently, the silicon oxide layer 11 is overlaid on the overall surface of the silicon substrate 1 on its side formed with the N$^-$ epitaxial layer 2. Thereafter, a resist film (not shown) having a predetermined opening pattern is formed over the silicon oxide layer 11. The silicon oxide layer 11 and the oxide film 7 are etched via this resist film. Thus is formed the contact hole 12 penetrating through the silicon oxide layer 11 and the oxide film 7, so that the P$^+$ base region and its peripheral N⁺ source region 4 are exposed in the contact hole 12. This state is shown in FIG. 2(c).

Then, the electrode film 14 of Al or alloy of Al and Si is formed by, for example, the sputtering method in a manner to cover the silicon oxide layer 11 and to fill in the contact hole 12. Thus is fabricated the semiconductor device 15 shown in FIG. 1.

The aforementioned fabrication method eliminates the necessity of embedding the low-resistance layer 9 in the whole space in the trench 6 having the high aspect ratio. This negates the need for using the expensive apparatus for fabricating the semiconductor device 15. That is, the semiconductor device 15 can be fabricated by an inexpensive apparatus.

Figure 3:
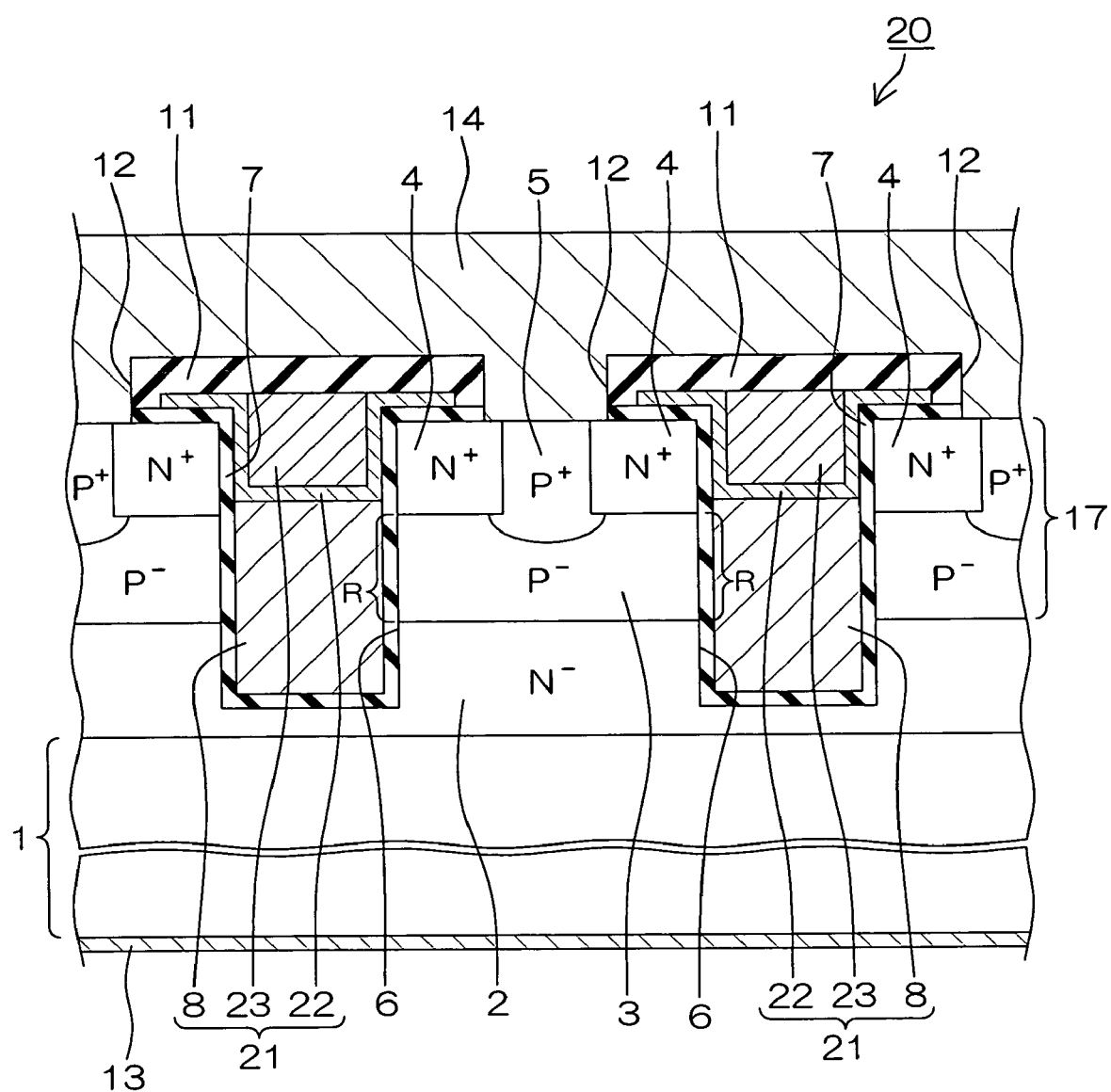
FIG. 3 is a sectional view illustrating a construction of a semiconductor device according to a second embodiment of the invention.

FIG. 3 is a sectional view illustrating a construction of a semiconductor device according to a second embodiment of the invention. In FIG. 3, individual parts corresponding to the parts shown in FIG. 1 are represented by the same reference characters, respectively, and the description thereof is dispensed with.

A semiconductor device 20 has a similar construction to that of the semiconductor device 15 shown in FIG. 1. A gate electrode 21 corresponding to the gate electrode 10 of the semiconductor device 15 includes the polysilicon layer 8, a barrier metal layer 22 and a low-resistance layer 23. The barrier metal layer 22 and the low-resistance layer 23 consist of the same materials as the barrier metal layer 16 and the low-resistance layer 9, respectively.

Out of the gate electrode 21, the barrier metal layer 22 and the low-resistance layer 23 project outwardly of the trench 6 by a height corresponding to the thickness of the barrier metal layer 22. Specifically, the low-resistance layer 23 is formed in an area over a position within the trench 6 and a position outside of the trench 6. A surface of the barrier metal layer 22 and a surface of the low-resistance layer 23, as positioned outside of the trench 6, are substantially flush with each other.

On the other hand, the P⁻ region 3 appearing in the inside wall of the trench 6 is in opposing relation only with the polysilicon layer 8 of the gate electrode 21, just as in the semiconductor device 15. The P⁻ region 3 does not oppose the barrier metal layer 22 nor the low-resistance layer 23. Therefore, the semiconductor device 20, similarly to the semiconductor device 15, may also have the threshold voltage (the drive voltage) equal to that of the conventional MOS FET commonly used in the art.

The low-resistance layer 23 of the semiconductor device 20 has a greater sectional area of a plane perpendicular to its longitudinal direction than that of the low-resistance layer 9 of the semiconductor device 15. Hence, the gate electrode 21 is reduced in the resistance with respect to the longitudinal direction thereof (the direction perpendicular to the drawing surface of FIG. 3) as compared with the resistance of the gate electrode 10 with respect to the longitudinal direction thereof (the direction perpendicular to the drawing surface of FIG. 1).

Such a semiconductor device 20 may be fabricated by the method for fabricating the semiconductor device 15, the method wherein the etch-back (etching) conditions for the low-resistance layer 9(23) and the barrier metal layer 16(22) are changed. Subsequent to the step of overlaying the low-resistance layer 9 on the overall surface of the silicon substrate 1 (see FIG. 2(b)), the low-resistance layer 9 is etched back. The etch-back process is terminated at the same time that the barrier metal layer 16 is exposed. Accordingly, the barrier metal layer 16 and the low-resistance layer 9 projects slightly outwardly of the trench 6. A surface of a portion of the barrier metal layer 16 that is positioned outside of the trench 6 is substantially flush with a surface of the low-resistance layer 9.

Subsequently, a resist film (not shown) having a suitable pattern is used for etching away the barrier metal layer 16 but for its portions within the trench 6 and around the trench 6, in a plan view as vertically looking down on the silicon substrate 1.

After the silicon oxide layer 11 is overlaid on the overall surface of the silicon substrate 1, the silicon oxide layer 11 and the oxide film 7 are etched away to form the contact hole 12 (see FIG. 2(c)). In this step, the silicon oxide layer 11 is left in a large area completely covering an area where the barrier metal layer 16 is formed, in a plan view as vertically looking down on the silicon substrate 1, so that the exposure of the barrier metal layer 16 is prevented.

According to the aforementioned fabricating method, the step of etching back the low-resistance layer 9 (23) may be terminated before the barrier metal layer 16(22) is exposed. In this case, there may be fabricated a MOS FET wherein the low-resistance layer 9(23) projects even further outwardly of the trench 6 as compared with the semiconductor device 20 shown in FIG. 3. This MOS FET is further reduced in the resistance with respect to the longitudinal direction of the gate electrode 10(21).

Figure 4:
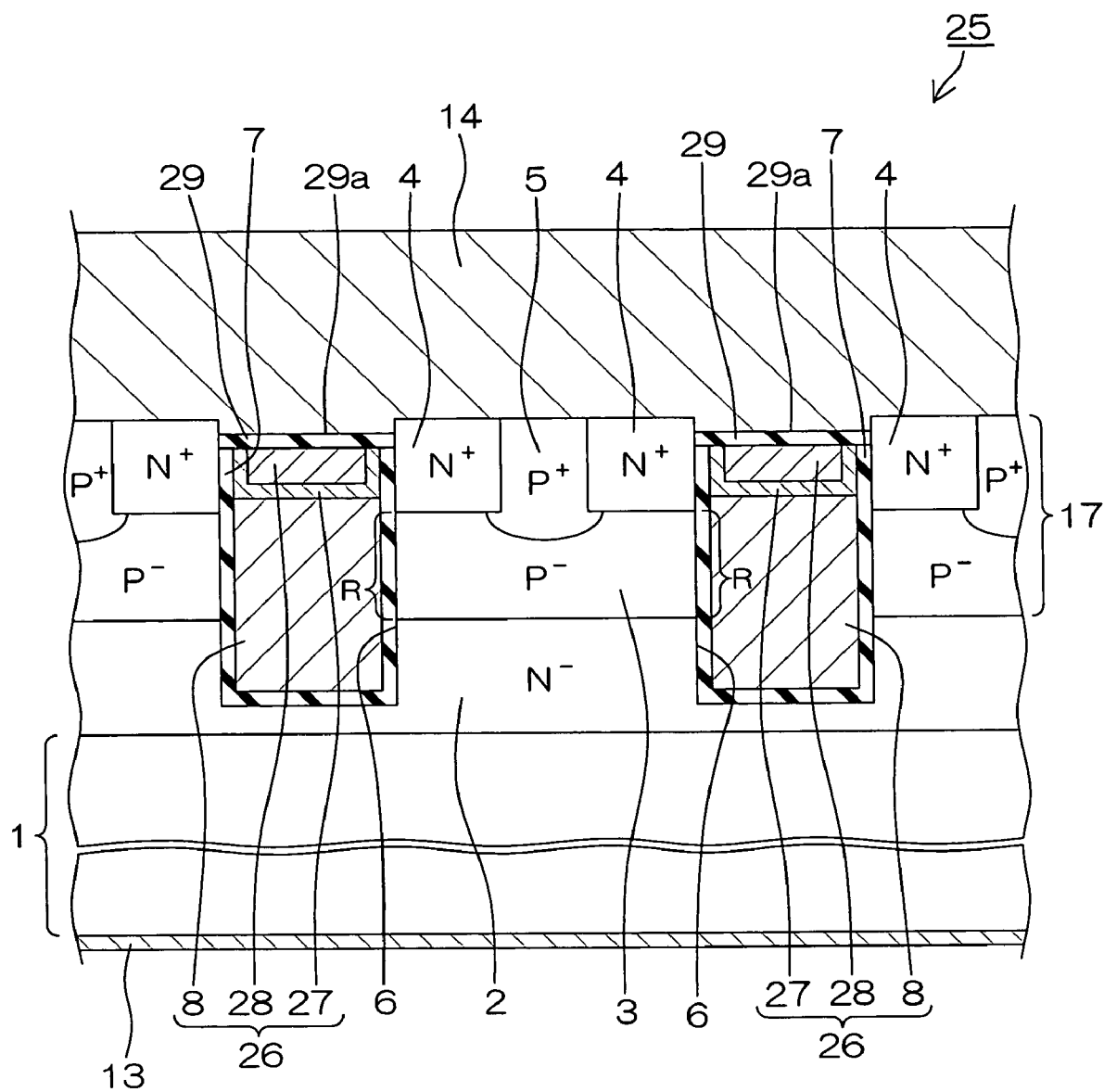
FIG. 4 is a sectional view illustrating a construction of a semiconductor device according to a third embodiment of the invention.
Figure 5:
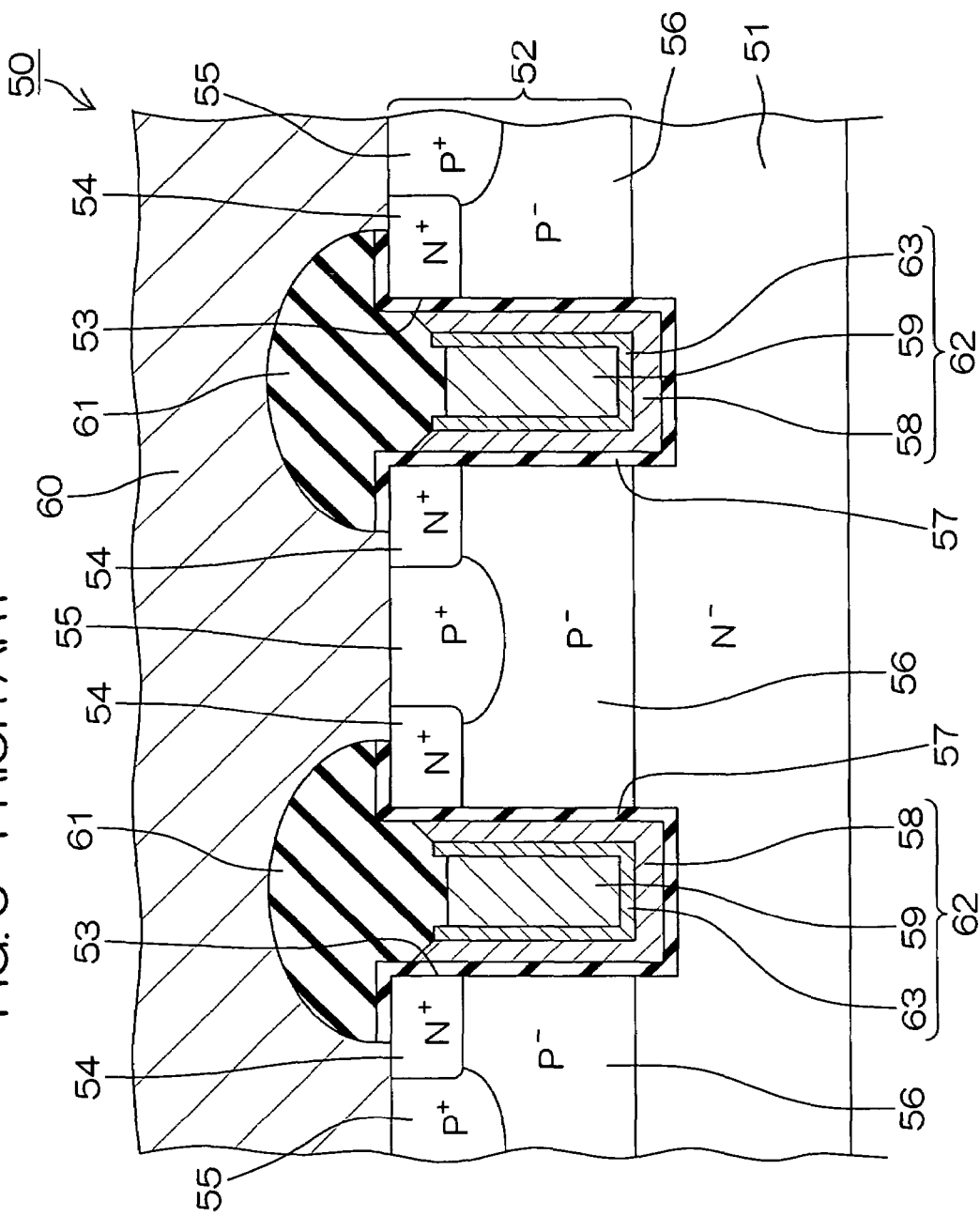
FIG. 5 is a sectional view illustrating a construction of a conventional semiconductor device formed with MOS FETs having a trench structure.

FIG. 4 is a sectional view illustrating a construction of a semiconductor device according to a third embodiment of the invention. In FIG. 4, individual parts corresponding to the parts shown in FIG. 1 are represented by the same reference characters, respectively, and the description thereof is dispensed with.

A semiconductor device 25 has a similar construction to that of the semiconductor device 15 shown in FIG. 1. A gate electrode 26 corresponding to the gate electrode 10 of the semiconductor device 15 includes the polysilicon layer 8, a barrier metal layer 27 and a low-resistance layer 28. The barrier metal layer 27 and the low-resistance layer 28 consist of the same materials as the barrier metal layer 16 and the low-resistance layer 9, respectively.

The low-resistance layer 28 and a silicon oxide layer 29 is formed thinner with respect to the depthwise direction of the trench 6, as compared with the low-resistance layer 9 and the silicon oxide layer 11 of the semiconductor device 15. A top surface 29a of the silicon oxide layer 29 is substantially fully accommodated in the trench 6. That is, the whole body of the silicon oxide layer 29 is accommodated in the trench 6.

Such a semiconductor device 25 may be fabricated by the method for fabricating the semiconductor device 15, the method wherein the etch-back (etching) conditions for the low-resistance layer 9(28), the barrier metal layer 16(27) and the silicon oxide layer 11(29) are changed.

Figure 2B:
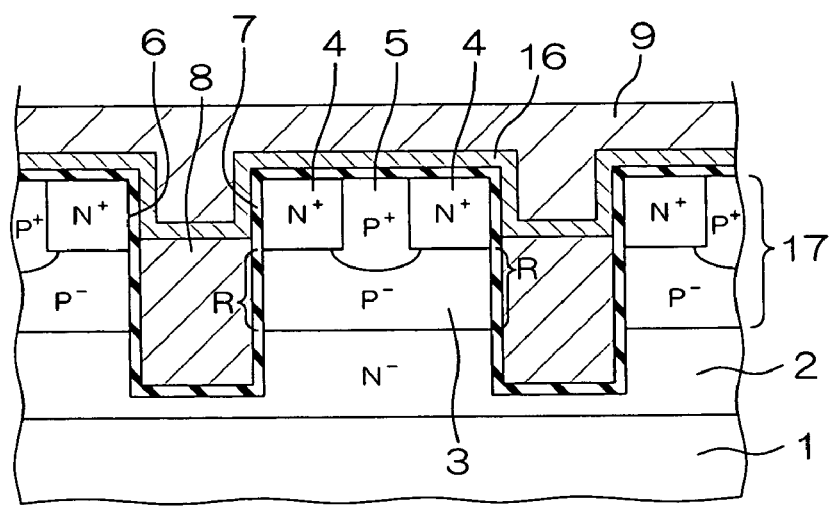
Figure 2C:
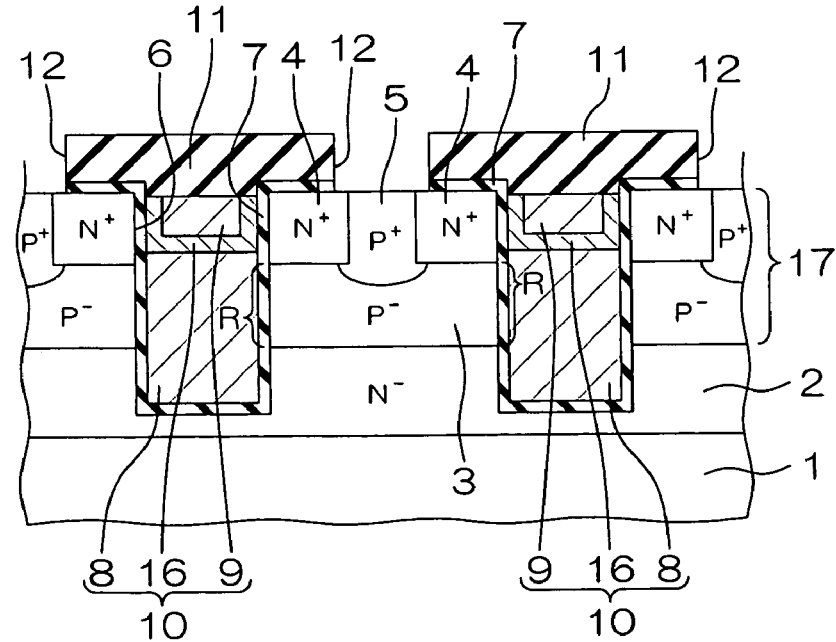

Subsequent to the step of overlaying the low-resistance layer 9(28) on the overall surface of the silicon substrate 1 (see FIG. 2(b)), the low-resistance layer 9(28) and the barrier metal layer 16(27) are etched back for removing portions of the low-resistance layer 9(28) and of the barrier metal layer 16(27) which are positioned outside of the trench 6 and at shallow areas in the trench 6. In the trench 6, therefore, a shallow cavity is formed above the low-resistance layer 9(28) and the barrier metal layer 16(27).

Subsequently, the silicon oxide layer 11(29) is overlaid on the overall surface of the silicon substrate 1 on its side formed with the N⁻ epitaxial layer 2. The silicon oxide layer 11(29) is etched back until the top surface 29a of the silicon oxide layer 11(29) is positioned within the trench 6. That is, the silicon oxide layer 11 (29) is so etched away as to remain only in the trench 6.

Thereafter, the electrode film 14 is formed the same way as in the method of fabricating the semiconductor device 15. Thus is fabricated the semiconductor device 25 shown in FIG. 4.

According to this fabrication method, the step of removing (etching back) the unwanted portion of the silicon oxide layer 11 eliminates the necessity of forming a mask (resist film) having a predetermined opening pattern in alignment with the silicon substrate 1 in order to etch away only a predetermined area of the silicon oxide layer 11 (29). Accordingly, it is easy to fabricate this semiconductor device 25.

While the preferred embodiments of the invention have been described as above, the invention may be practiced in different modes. In the foregoing embodiments, for instance, the description is made on the semiconductor devices including the MOS FET formed on the silicon substrate 1. However, the semiconductor device according to the invention may be a semiconductor device including an IGBT (Insulated Gate Bipolar Transistor) formed on the silicon substrate 1.

In the foregoing embodiments, the $P^-$ region 3, the $N^+$ source region 4 and the $P^+$ base region 5 are formed prior to the formation of the trench 6 and the gate electrode 10. However, these regions 3, 4, 5 may be formed subsequent to the formation of the trench 6 and the gate electrode 10.

While the preferred embodiments of the invention have been described in details, it is noted that these embodiments are mere illustrative examples for clarifying the technical nature of the invention. Hence, the invention should not be interpreted in a narrow sense defined by these specific examples thereof. The true spirit and scope of the invention are defined solely by the accompanying claims.

This application is in correspondence to Patent Application No. 2003-387066 filed with Japanese Patent Office on Nov. 17, 2003, and the whole disclosure thereof is incorporated herein by reference.

What is claimed is:

1. A semiconductor device, comprising:
a channel region formed in a surface of a semiconductor substrate in a first depth range, a trench being formed in the surface as penetrating the channel region in a depthwise direction;
a drain region, formed in the semiconductor substrate in a third depth range, at a greater depth than the channel region;
a source region formed in the semiconductor substrate in a second depth range, on a side of the channel region opposed to the drain region in the depthwise direction;
a gate insulating film formed on an inside wall of the trench, the gate insulating film being in contact with the channel region;
a gate electrode including: a polysilicon layer opposing the channel region with the gate insulating film interposed therebetween, the polysilicon layer being embedded in an internal space of the trench at least in the first depth range;
a low-resistance layer essentially formed from a metal element and disposed in the trench, above the polysilicon layer that opposes the channel region, and entirely located above the first depth range;
a barrier metal layer entirely located above the first depth range and interposed between the polysilicon layer and the low-resistance layer such that the metal atoms diffusion from the low-resistance layer into the polysilicon layer is retarded; and
an insulating layer disposed on the low-resistance layer and having a top surface positioned within the trench, wherein:
in a surface of the low-resistance layer, a region opposing the polysilicon layer is entirely located at a smaller depth with respect to the depthwise direction of the trench than the first depth range.

2. A semiconductor device, according to claim 1, wherein the metal element of the low-resistance layer is at least one of Al, Cu, W, Ti, Ni, Mo, Co, Ag, Pt and Pb.

3. A semiconductor device, according to claim 1, wherein the metal element is contained in the low-resistance layer as metal silicide.

4. A semiconductor device, according to claim 1, wherein the low-resistance layer is formed as extending beyond the surface of the substrate.

* * * * *